United States Patent
Yoshida

(10) Patent No.: US 9,033,473 B2
(45) Date of Patent: May 19, 2015

(54) PIEZOELECTRIC DEVICE, INKJET EQUIPMENT USING THE PIEZOELECTRIC DEVICE, AND THE INKJET PRINTING METHOD

(71) Applicant: Panasonic Corporation, Kadoma-shi, Osaka (JP)

(72) Inventor: Hidehiro Yoshida, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/290,381

(22) Filed: May 29, 2014

(65) Prior Publication Data
US 2014/0354737 A1    Dec. 4, 2014

(30) Foreign Application Priority Data

May 29, 2013    (JP) ................................ 2013-112600

(51) Int. Cl.
| | | |
|---|---|---|
| B41J 2/045 | (2006.01) | |
| H01L 41/047 | (2006.01) | |
| B41J 2/14 | (2006.01) | |
| B41J 2/16 | (2006.01) | |

(52) U.S. Cl.
CPC ............ *H01L 41/0471* (2013.01); *B41J 2/045* (2013.01); *B41J 2/14201* (2013.01); *B41J 2002/14258* (2013.01); *B41J 2/14274* (2013.01); *B41J 2/1612* (2013.01); *B41J 2/1632* (2013.01); *B41J 2/1646* (2013.01)

(58) Field of Classification Search
CPC ...... B41J 2/14233; B41J 2/1623; B41J 2/161; B41J 2002/14491; B41J 2002/1449; B41J 2/14209; B41J 2/1609; B41J 2/1632; B41J 2/1646; B41J 2002/14225; B41J 2002/14217; B41J 2/14274; B41J 2/14201; B41J 2002/14258; H01L 41/047; H01L 41/083; H01L 41/0926; H01L 41/39; H01L 41/107; H01L 41/0472; H03H 9/132; H03H 9/19
See application file for complete search history.

(56) References Cited

U.S. PATENT DOCUMENTS

| | | | | |
|---|---|---|---|---|
| 5,945,773 A | * | 8/1999 | Nagashima | .................... 310/328 |
| 6,724,129 B2 | * | 4/2004 | Nakatani | ....................... 310/328 |

FOREIGN PATENT DOCUMENTS

JP    H09-174830 A    7/1997

\* cited by examiner

*Primary Examiner* — Geoffrey Mruk
(74) *Attorney, Agent, or Firm* — Hamre, Schumann, Mueller & Larson, P.C.

(57) ABSTRACT

A piezoelectric device according to the present invention is a laminated body including stacked first and second sheets. The laminated body is divided by a plurality of grooves.
In the laminated body, first driving units each have a fifth region where the first electrode of the first sheet and the second electrode of the second sheet are opposed to each other while second driving units each have a sixth region where the first electrode of the first sheet and the second electrode of the second sheet are opposed to each other. The grooves are interposed between the driving units.
The fifth regions of the first driving units are located along a straight line separate from a straight line along which the sixth regions of the second driving units are located.

11 Claims, 20 Drawing Sheets

1(A)

1(B)

1(C)

4(A)

4(B)

4(C)

7(A)

7(B)

F I G. 9
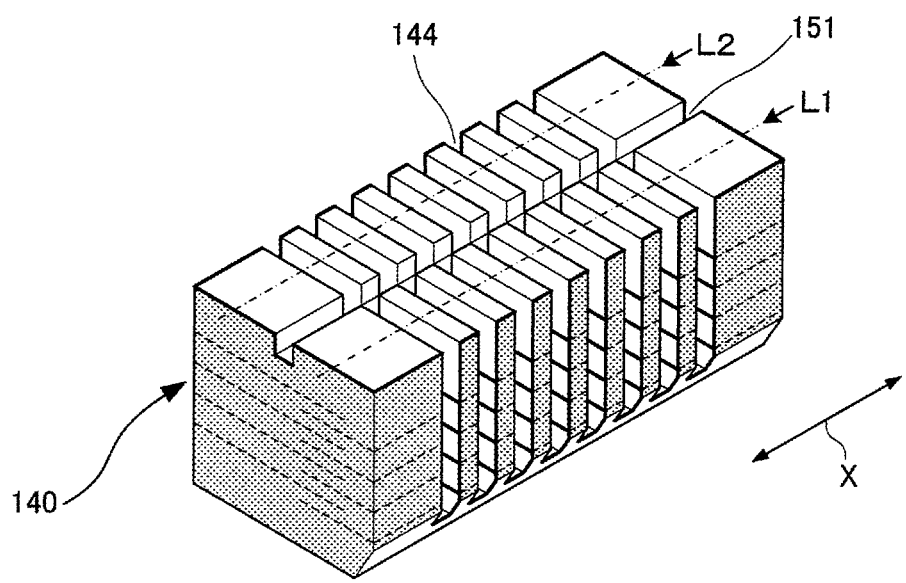

12(A)

12(B)

14(A)

14(B)

18(A)

18(B)

18(C)

F I G. 2 1    PRIOR ART
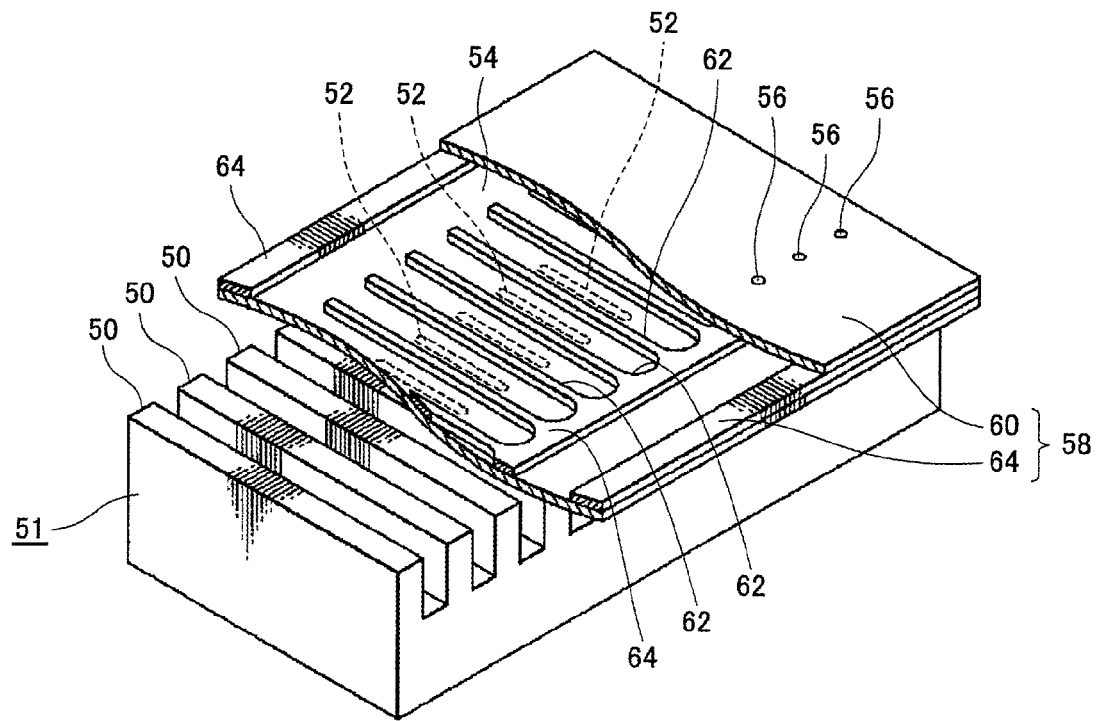
F I G. 2 2    PRIOR ART
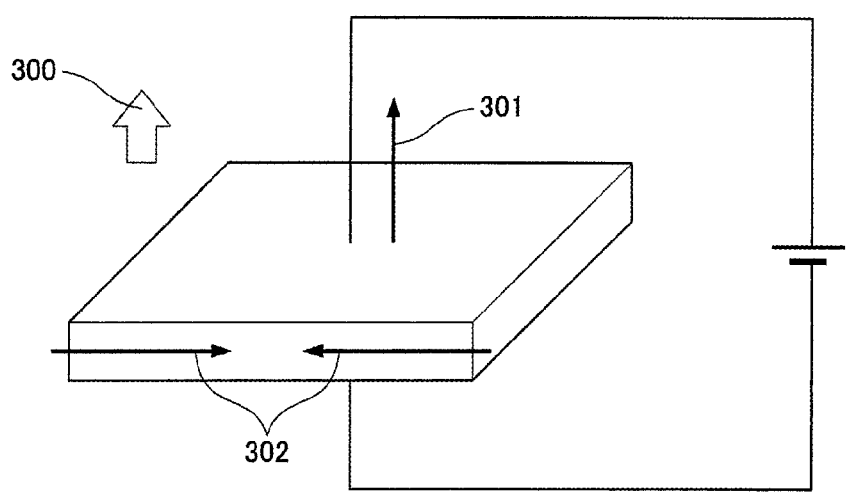

PIEZOELECTRIC DEVICE, INKJET EQUIPMENT USING THE PIEZOELECTRIC DEVICE, AND THE INKJET PRINTING METHOD

FIELD OF THE INVENTION

The present invention relates to a stacked piezoelectric device, for example, a piezoelectric device usable for an inkjet head.

BACKGROUND OF THE INVENTION

In recent years, methods for manufacturing electronic devices by ink-jet technology have received much attention. In response to electronic devices having higher densities, inkjet heads with higher densities have been demanded.

Stacked piezoelectric devices or thin piezoelectric devices are used for driving inkjet heads. Referring to FIGS. 19 to 21, an example of a piezoelectric device in Japanese Patent Laid-Open No. 9-174830 will be described below.

The piezoelectric device is configured for higher densities. An inkjet head in FIGS. 19 and 20 includes a piezoelectric device unit 51 having a plurality of piezoelectric devices 50, a diaphragm 12 that has a plurality of vibratory projecting portions 10 for the piezoelectric devices 50 and transmits vibrations generated on the piezoelectric devices 50 through the vibratory projecting portions 10, and a nozzle plate 18 having a plurality of nozzle holes 14 formed thereon for the piezoelectric devices 50. Ink is injected from the nozzle holes 14 in response to vibrations transmitted from the piezoelectric devices 50 through the vibratory projecting portions 10.

The piezoelectric device 50 has dielectrics stacked in an X direction of FIG. 19. A voltage applied to the piezoelectric devices 50 in the X direction extends or shrinks the piezoelectric devices 50 in a Z direction, ejecting ink from the nozzle holes 14 in the Z direction. The nozzle holes 14 are staggered at different positions in the X direction in the nozzle plate 18.

FIG. 20 is a cross-sectional view taken along the line a-b of FIG. 19. A driving force from the piezoelectric devices 50 is transmitted to a passage 20 through the vibratory projecting portions 10, ejecting ink droplets Id from the nozzle holes 14 formed on the nozzle plate 18. A passage component 22 indicates an ink passage. A substrate 16 is composed of the passage component 22 and the nozzle plate 18.

FIG. 21 shows another piezoelectric device having different nozzle hole layout from FIG. 19.

As shown in FIG. 21, if ink droplets are simultaneously ejected from three nozzle holes 56 through vibratory projecting portions 52 and a diaphragm 54, a central passage 62 is deformed to a maximum level because of insufficient rigidity of a substrate 58 composed of a nozzle plate 60 and passage components 64. Hence, a volume reduction rate in the central passage 62 is smaller than that on both sides of the passage 62.

Thus, in the piezoelectric device of FIGS. 19 and 20, the nozzle holes 14 are staggered so as to suppress a volume reduction.

DISCLOSURE OF THE INVENTION

In response to future electronic devices with higher densities, smaller cell sizes of the electronic devices are necessary and inkjet heads used for manufacturing the electronic devices require higher densities than conventional inkjet heads. Ink needs to be scattered with a wide ink viscosity range from a low viscosity to a viscosity.

FIG. 22 is an explanatory drawing showing extension and shrinkage of the piezoelectric device 50.

An electric field applied in parallel with a polarization direction 300 of the piezoelectric device generates a turning force to electric dipoles arranged in a straight line, changing the length of a single crystal. A crystal is extended in the same direction as an electric field while the crystal is shortened perpendicularly to the electric field. A direction 301 of extension of a crystal is referred to as a d33 mode while a direction 302 of shortening of a crystal is referred to as a d31 mode. It is generally known that a change of a crystal is larger in the d33 mode than in the d31 mode.

The conventional piezoelectric device is formed by driving in the d31 mode. The piezoelectric device 50 in FIG. 19 includes dielectrics stacked in the X direction. A voltage applied in the X direction extends or shrinks the piezoelectric devices in the Z direction, thereby ejecting ink.

The inkjet head in FIGS. 19 and 20 does not have a pole for fixation and thus is likely to be affected by vibrations of the adjacent piezoelectric devices.

An object of the present invention is to provide a piezoelectric device with vibrating portions arranged in a staggered pattern.

Another object of the present invention is to provide an inkjet head including the piezoelectric device, the inkjet head being capable of ejecting ink with a wide range from a low viscosity to a high viscosity while hardly affecting the ejection speed and volume of droplets from adjacent and close nozzles.

In order to attain the objects, a piezoelectric device of the present invention is a piezoelectric device composed of a laminated body in which a first sheet and a second sheet are stacked, the piezoelectric device including: a plurality of units that are divided by a plurality of grooves formed from the top surface of the laminated body to a point before the undersurface of the laminated body; a conductive film formed on the surface of the laminated body; a first electrode formed up to each end of at least two sides of the surface of the first sheet; and a second electrode formed up to each end of at least two sides of the surface of the second sheet, wherein the first electrode includes the proximal end of a first region located on a first side of the laminated body and the end of a second region directed to a second side of the laminated body, the second side being opposed to the first side, the second electrode includes the proximal end of a third region located on the second side and the end of a fourth region directed to the first side, the conductive film electrically connects the second electrode on the second side and a part of the first electrode on the first side, the plurality of units with the grooves interposed between the units include a first driving unit having a fifth region where the fourth region and the first region are opposed to each other and a second driving unit having a sixth region where the second region and the third region are opposed to each other, and a plurality of straight lines connect the center of the region of the first driving unit and the center of the region of the second driving unit when viewed in the stacking direction.

According to the present invention, the piezoelectric device with vibrating portions in a staggered pattern can be obtained by designing the shapes of the first to second electrodes. The application of the piezoelectric device to an inkjet head can precisely obtain an inkjet coating as in driving with a single nozzle without affecting the ejection speed or volume of droplets from adjacent nozzles. In other words, an inkjet head coating can be evenly obtained with small variations in droplet volume among heads, high densities, and high accuracy.

BRIEF DESCRIPTION OF THE DRAWINGS

FIG. 1 (B) is a perspective view of a second sheet;

FIG. 1 (C) is a perspective view of a third sheet;

FIG. 4 (B) is a rear view of the laminated body;

FIG. 4 (C) is a perspective view of the partially removed laminated body viewed from the front;

FIG. 6 (B) is a front view of FIG. 6(a);

FIG. 7 (B) is a cross-sectional view taken along the line h-hh of FIG. 6(b);

FIG. 8 (B) is a perspective view showing a stacked state of the electrodes viewed from the top surface of the piezoelectric device with the formed grooves 144;

FIG. 9 is a perspective view of the piezoelectric device including another groove 151 on the top surface according to the first embodiment;

FIG. 10 (B) is a perspective view of a second sheet;

FIG. 11 (B) is a perspective view showing a stacked state of the electrodes viewed from the top surface of the piezoelectric device with the formed grooves 144;

FIG. 12 (B) is a perspective view of a second sheet;

FIG. 13 (B) is a perspective view showing a stacked state of the electrodes viewed from the top surface of the piezoelectric device with the formed grooves 144;

FIG. 14 (B) is a perspective view of a second sheet;

FIG. 15 (B) is a perspective view showing a stacked state of the electrodes viewed from the top surface of the piezoelectric device with the formed grooves 144;

FIG. 16 (B) is a perspective view of a second sheet;

FIG. 17 (B) is a perspective view showing a stacked state of the electrodes viewed from the top surface of the piezoelectric device with the formed grooves 144;

FIG. 18 (B) is a plan view of the inkjet printer;

FIG. 18 (C) is a perspective view of the bottom of a line head 50;

FIG. 21 is a perspective view of an inkjet head including the conventional piezoelectric device; and FIG. 22 is an explanatory drawing illustrating the direction of an applied voltage and the directions of extension and shrinkage in the piezoelectric device.

DESCRIPTION OF THE EMBODIMENTS

Figure 1:
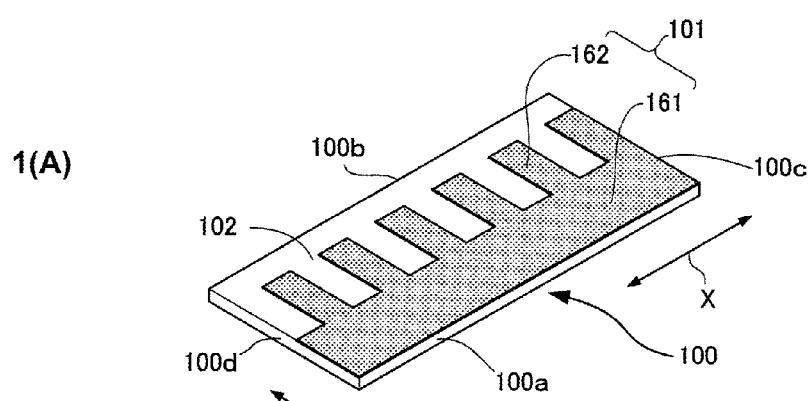
FIG. 1 (A) is a perspective view showing a first sheet used for a piezoelectric device according to a first embodiment of the present invention.
Figure 1:
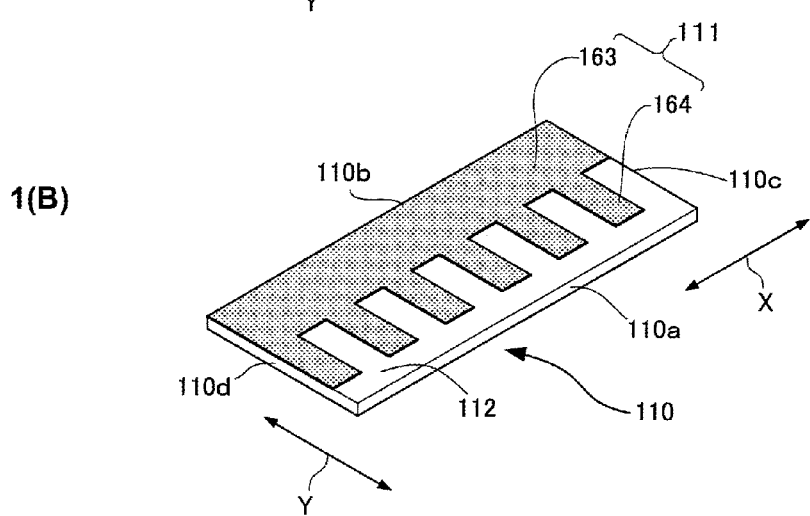
Figure 1:
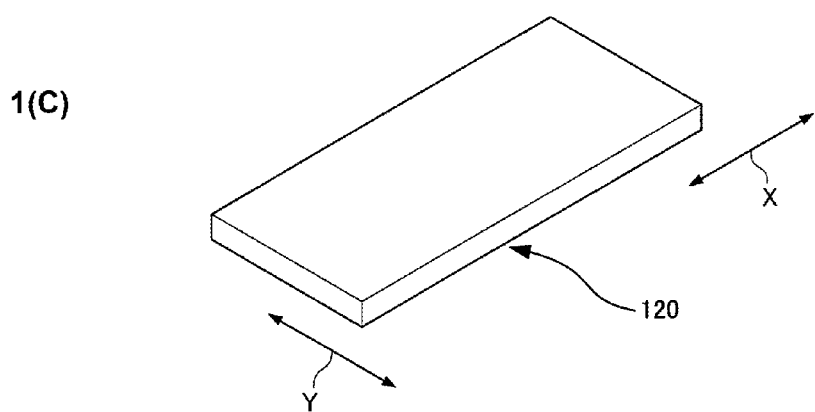

Embodiments of the present invention will be described below with reference to the accompanying drawings.

First Embodiment

A first embodiment describes a piezoelectric device 140 shown in FIGS. 6(a) and 6(b) and a method of manufacturing the same. FIGS. 6(a) and 6(b) are schematic diagrams illustrating the structure of the piezoelectric device 140 for ease of understanding.

FIGS. 1(a), 1(b), and 1(c) are perspective views of first, second, and third piezoelectric sheets 100, 110, and 120 used for manufacturing the piezoelectric device 140. The first, second, and third sheets 100, 110, and 120 are green sheets before burning.

A first electrode 101 and a first non-electrode region 102 are disposed on the top surface of the first sheet 100 having a rectangular principal surface. A non-electrode region is formed over the undersurface of the first sheet 100.

A second electrode 111 and a second non-electrode region 112 are disposed on the top of the second sheet 110 having a rectangular principal surface. A non-electrode region is formed over the undersurface of the second sheet 110.

Both the top surface and undersurface of the third sheet 120 with a rectangular principal surface have non-electrode regions.

The electrode patterns of the first and second electrodes 101 and 111 are formed by silver paste or the like and are printed by, for example, screen printing. The sheets are 5 to 100 μm, desirably 10 to 50 μm in thickness before burning.

In FIG. 1, X denotes a long-side direction while Y denotes a short-side direction.

The shape of the first electrode 101 includes a first region 161 shaped like a large rectangle and a plurality of second regions 162 shaped like small rectangles.

The first sheet 100 has first and second long sides 100a and 100b opposed to each other and first and second short sides 100c and 100d opposed to each other. The long sides of the first region 161 are as long as the first and second long sides 100*a* and 100*b*. The short sides of the first region 161 are shorter than the first and second short sides 100*c* and 100*d*.

One of the long sides of the first region 161 is in contact with the first long side 100*a*. The short sides of the first region 161 are in contact with the first and second short sides 100*c* and 100*d*.

The proximal ends of the second regions 162 are connected to the other long side of the first region 161 and are formed at predetermined intervals along the first and second long sides 100*a* and 100*b*. The ends of the second regions 162 extend toward the second long side 100*b* but do not reach the second long side 100*b*.

The second electrode 111 identical in shape to the first electrode 101 has a third region 163 shaped like a large long rectangle and a plurality of fourth regions 164 shaped like small rectangles.

The second sheet 110 has first and second long sides 110*a* and 110*b* opposed to each other and first and second short sides 110*c* and 110*d* opposed to each other. The long side of the third region 163 is as long as the first and second long sides 110*a* and 110*b*. The short side of the third region 163 is shorter than the first and second short sides 110*c* and 110*d*. One of the long sides of the third region 163 is in contact with the second long side 110*b*. Both short sides of the third region 163 are in contact with the first and second short sides 110*c* and 110*d*.

The proximal ends of the fourth regions 164 are connected to the other long side of the third region 163 and are formed at predetermined intervals along the first and second long sides 110*a* and 110*b*. The ends of the fourth regions 164 extend toward the first long side 110*a* but do not reach the first long side 110*a*.

Figure 2:
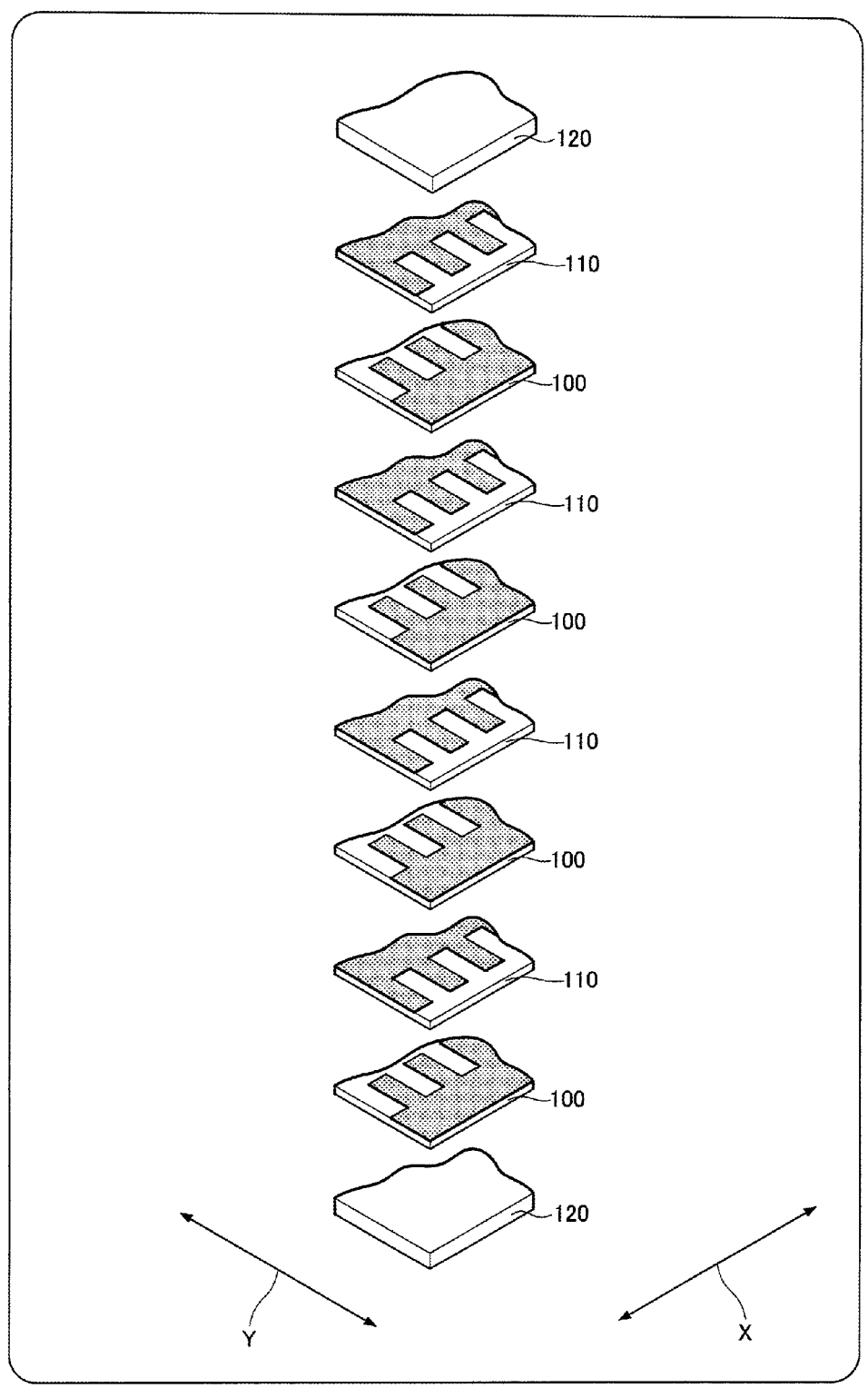
FIG. 2 is an exploded view of a principal part in a stacking state of the first, second, and third sheets.
Figure 3:
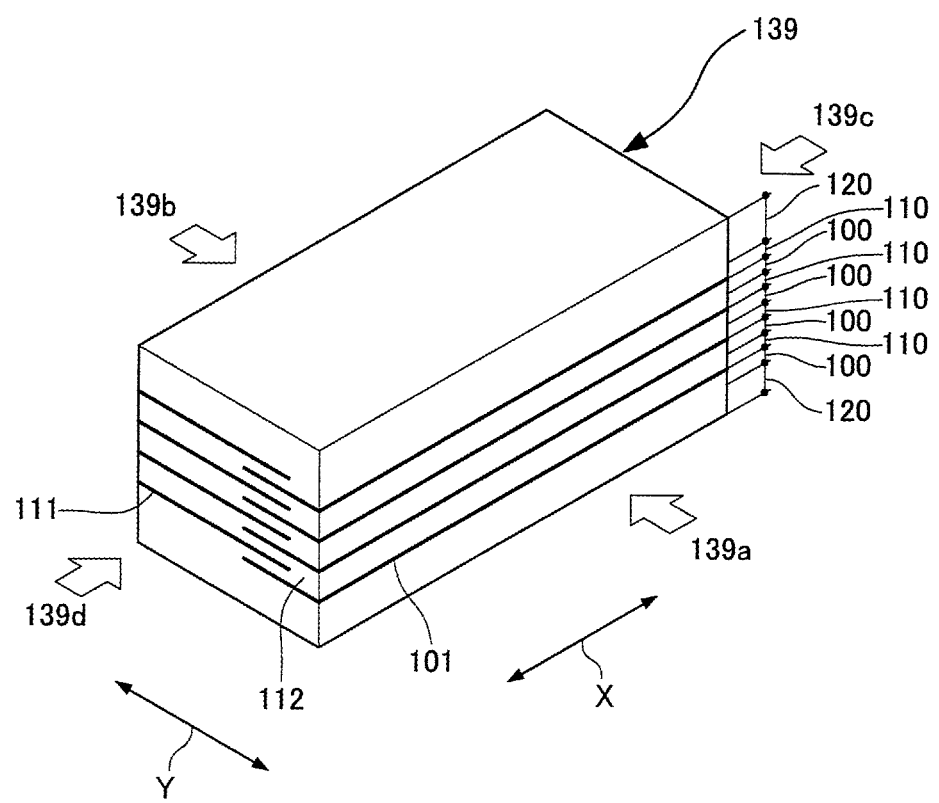
FIG. 3 is a perspective view of a laminated body including the stacked first, second, and third sheets.

As shown in FIG. 2, the first sheets 100 and the second sheets 110 are alternately stacked on the third sheet 120 disposed at the bottom. Finally, another third sheet 120 is stacked thereon and then the sheets are sintered so as to form a laminated body 139 shown in FIG. 3.

It is preferable that the third sheets 120 at the top and bottom are substantially identical in thickness. This is because warpage is reduced during the sintering.

The end faces of the first electrode 101 and the second electrode 111 are exposed on right and left sides 139*c* and 139*d* of the laminated body 139 after the sintering, allowing nondestructive observation of the first and second electrodes 101 and 111.

In this example, the third sheets 120 having the same thickness are stacked and sintered at the top and bottom during the production of the laminated body 139. The third sheets 120 at the top and bottom may vary in thickness.

Figure 4:
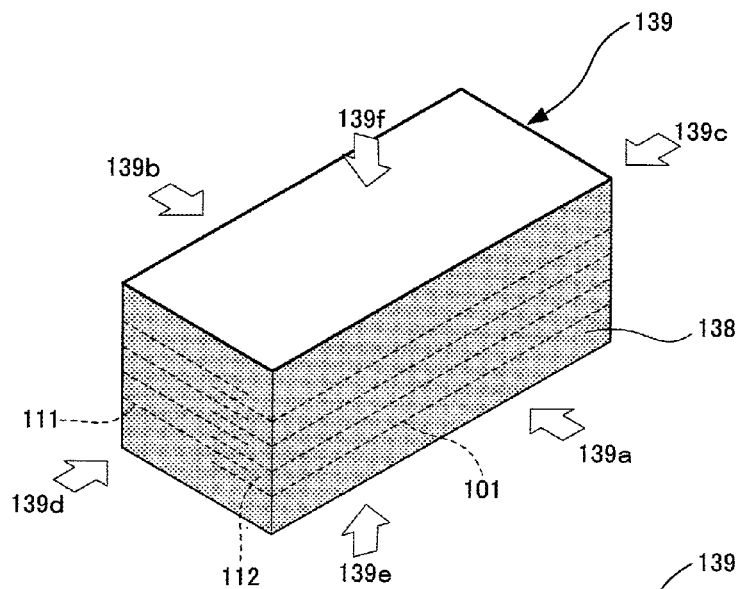
FIG. 4 (A) is a perspective view of the laminated body viewed from the front with a conductive film.
Figure 4:
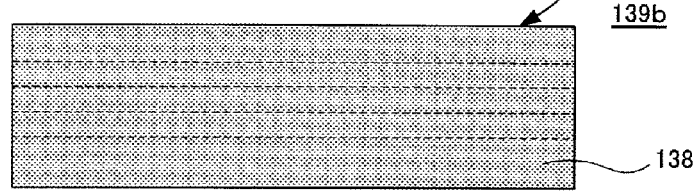
Figure 4:
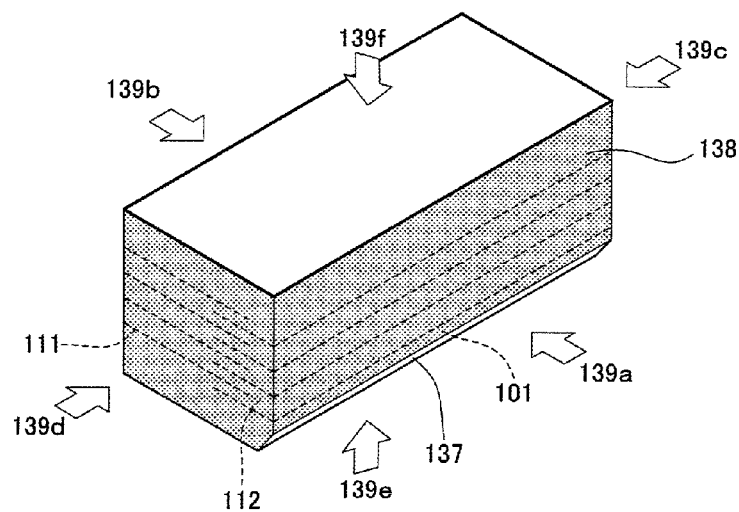

As shown in FIG. 4(*a*), a conductive film 138 containing, for example, 1 to 10 nm of chromium and 100 to 800 nm of gold is formed by a method such as sputtering as indicated by a hatch pattern over the surfaces of the laminated body 139 other than an undersurface 139*e* and a top surface 139*f* of the laminated body 139 after the sintering. Chromium may be replaced with titanium electrodes while gold electrodes may be replaced with silver electrodes, platinum electrodes, and so on.

Thus, the second electrode 111 exposed on a second side 139*b* of the laminated body 139 and the first electrode 101 exposed on a first side 139*a* of the laminated body 139 are electrically connected to each other by the conductive film 138 through the left side 139*d* and the third side 139*c* of the laminated body 139. FIG. 4(*b*) shows the second side of the laminated body 139.

Subsequently, as shown in FIG. 4(*c*), the lower corner of the first side 139*a* of the laminated body 139 is partially removed so as to remove the conductive film 138 formed on the removed part, forming an exposed part 137.

Figure 6:
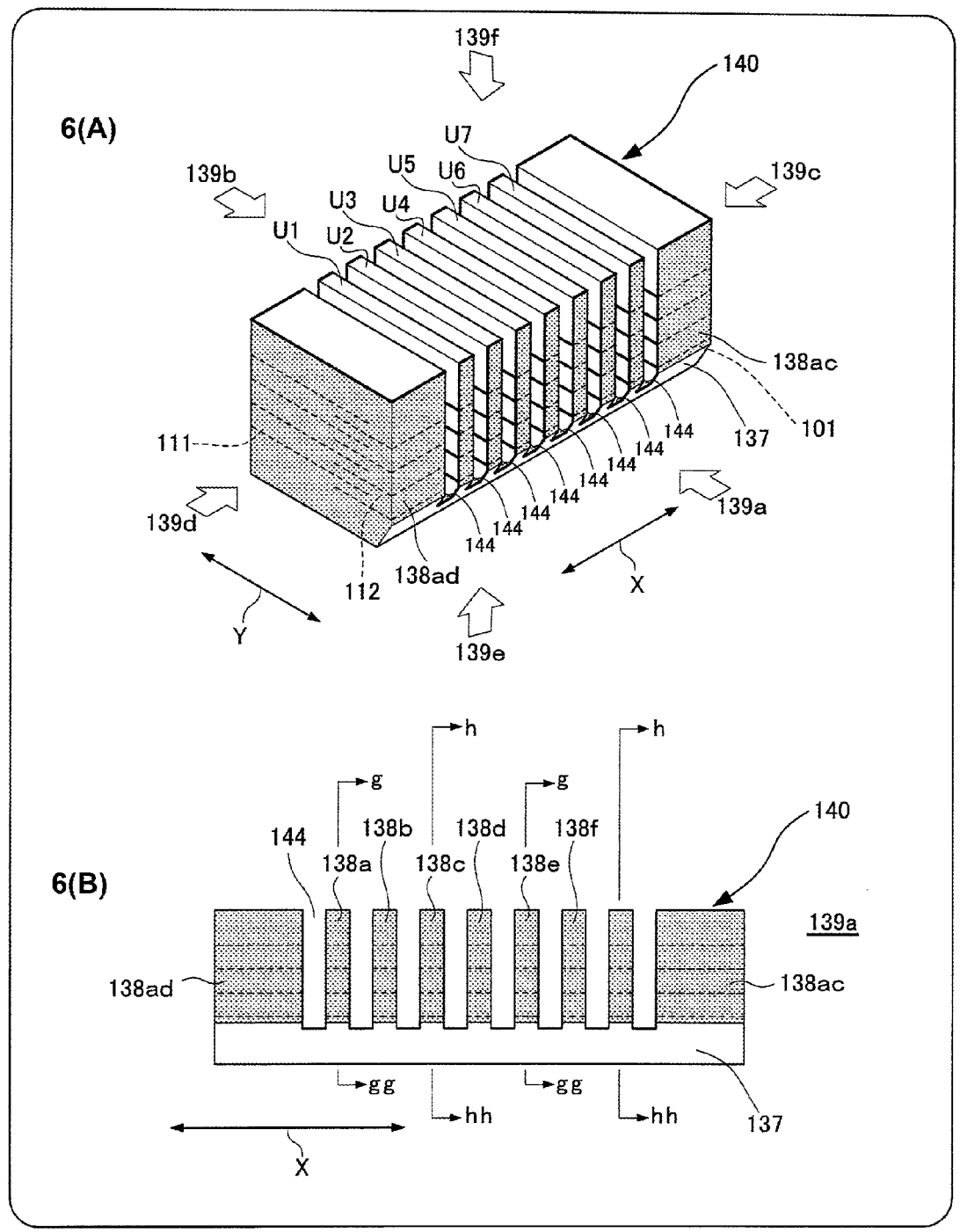
FIG. 6 (A) is a perspective view of the piezoelectric device including the laminated body with a plurality of grooves.

The laminated body 139 in FIG. 4(*c*) is then diced by a dicer so as to form a plurality of grooves 144 spaced at predetermined intervals as shown in FIG. 6(*a*). The bottoms of the grooves 144 reach the exposed part 137. The grooves 144 divide a part of the conductive film 138 on the second side 139*b* and a part of the conductive film 138 on the first side 139*a*.

Specifically, the conductive film 138 on the first side 139*a* is divided into an electrode 138*ac* near the third side 139*c* connected to the second electrodes 111, an electrode 138*ad* near the fourth side 139*d* connected to the second electrodes 111, and a plurality of electrodes 138*a*, 138*b*, 138*c*, . . . between the electrode 138*ad* and the electrode 138*ac*.

In FIG. 6(*b*), the piezoelectric device 140 having the formed grooves 144 is viewed from the first side 139*a*. The piezoelectric device 140 has a plurality of adjacent units U1, U2, U3, . . . between the electrode 138*ad* and the electrode 138*ac*.

Figure 7:
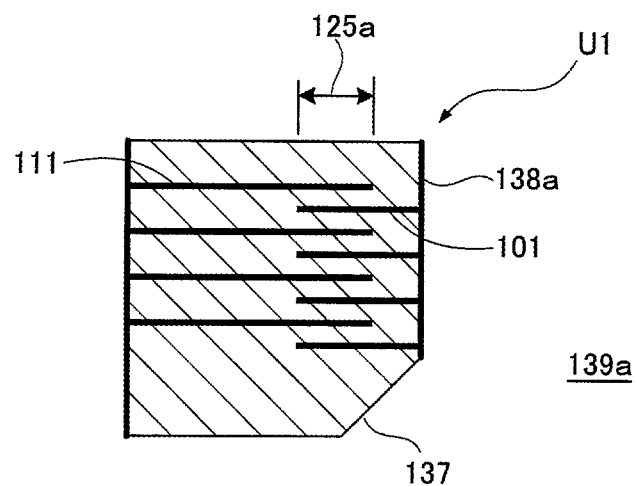
FIG. 7 (A) is a cross-sectional view taken along the line g-gg of FIG. 6(b)
Figure 7:
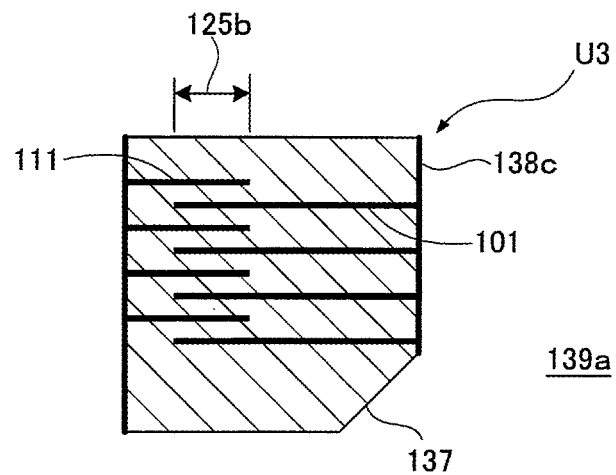

FIGS. 7(*a*) and 7(*b*) are cross-sectional views taken along lines g-gg and h-hh of FIG. 6(*b*).

In FIG. 7(*a*), the first electrodes 101 and the second electrodes 111 overlap each other in a fifth region 125*a* close to the first side 139*a*; meanwhile, the first electrodes 101 and the second electrodes 111 do not overlap each other at a position closer to the second side 139*b* than the fifth region 125*a*.

In FIG. 7(*b*), the first electrodes 101 and the second electrodes 111 overlap each other in a sixth region 125*b* close to the second side 139*b*; meanwhile, the first electrodes 101 and the second electrodes 111 do not overlap each other at a position closer to the first side 139*a* than the sixth region 125*b*.

Figure 8:
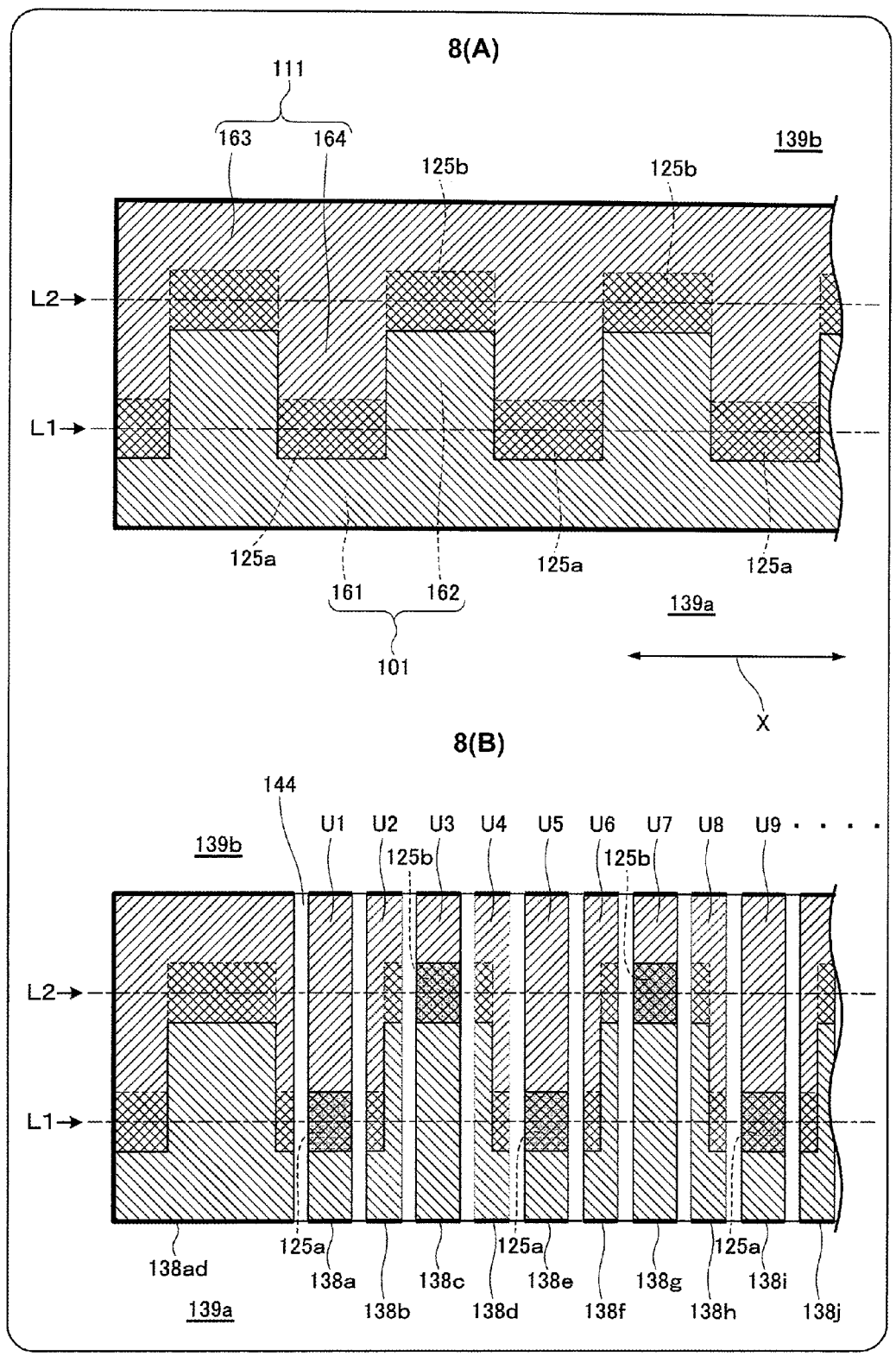
FIG. 8 (A) is a perspective view of the laminated body with stacked electrodes viewed from the top surface of the piezoelectric device before grooves 144 are formed.

FIGS. 8(*a*) and 8(*b*) are enlarged plan views more realistically illustrating the configurations of FIGS. 4(*a*) to 4(*c*) and 6(*a*) and 6(*b*). FIG. 8(*a*) illustrates the laminated body 139 from the top surface 139*f* before the grooves 144 are formed. FIG. 8(*b*) illustrates the piezoelectric device 140 with the formed grooves 144 viewed from the top surface 139*f*.

When the first electrode 101 on the first sheet 100 in FIG. 1(*a*) and the second electrode on the second sheet 110 in FIG. 1(*b*) are stacked, as shown in FIG. 8(*a*), the first region 161 of the first electrode 101 and the end of the fourth region 164 of the second electrode 111 overlap each other in the fifth region 125*a* while the third region 163 of the second electrode 111 and the end of the second region 162 of the first electrode 101 overlap each other in the sixth region 125*b*.

A center line L1 along the longitudinal direction X passes through the centers of the adjacent fifth regions 125*a*. A center line L2 along the longitudinal direction X of the piezoelectric device 140 passes through the centers of the adjacent sixth regions 125*b*.

The grooves 144 are formed on the laminated body 139 after burning, thereby obtaining the piezoelectric device 140 as shown in FIG. 8(*b*). The piezoelectric device 140 includes three kinds of units: units U1, U5, U9, . . . serving as first driving units having only the fifth regions 125*a*; units U3, U7, . . . serving as second driving units having only the sixth regions 125*b*; and units U2, U4, U6, U8, U10, . . . serving as intermediate units having the fifth regions 125*a* and the sixth regions 125*b*.

The piezoelectric device 140 is driven to selectively apply a driving voltage to the units U1, U3, U5, U7, U9, . . . (will be referred to as the first driving units) other than the units U2, U4, U6, U8, U10, . . . (will be referred to as the intermediate units). Specifically, a signal voltage is selectively applied to the electrode 138*ad* of the first side 139*a* or to the electrode 138*ad* and between the electrodes 138*a*, 138*e*, 138*i*, . . . formed on the first side 139*a* of the units U1, U5, U9, . . . .

Alternatively, a signal voltage is selectively applied to the electrode 138*ad* or to the electrode 138*ad* and between the electrodes 138*c*, 138*g*, . . . formed on the first side 139*a* of the units U3, U7, . . . (will be referred to as the second driving units).

A signal voltage is not applied to the intermediate units.

The first and second driving units are disposed next to each other via the intermediate units and thus vibrations from the first driving units are blocked by the intermediated units without being transmitted to the second driving units. Thus, vibrations from the first driving units do not affect vibrations from the second driving units. Moreover, vibrations from the second driving units are blocked by the intermediate units without being transmitted to the first driving units and thus vibrations from the second driving units do not affect the first driving units.

If the piezoelectric device 140 is used for an inkjet head, nozzle holes are formed at the corresponding positions of the fifth regions 125*a* and the corresponding positions of the sixth regions 125*b* on a nozzle plate, achieving an inkjet head having the nozzle holes arranged in a staggered pattern.

The conductive film 138 may be provided at the bottom of the laminated body 139 instead of on the sides of the laminated body 139 so as to connect the second side 139*c* and the electrode 138*ac* or the electrode 138*ad*. For a large amount of current, the conductive film 138 may be provided on both of the sides and the undersurface 139*e* of the laminated body 139 so as to connect the second side 139*c* and the electrode 138*ac* or the electrode 138*ad*.

In the present embodiment, the first and second electrodes 101 and 111 exposed on both sides of the left side 139*d* and the right side 139*b* can be observed in a nondestructive manner before the conductive film 138 is formed. This allows inspections of the location and amount of maximum displacement of the piezoelectric device 140. Thus, these inspections can discern the piezoelectric device 140 used for an inkjet device or the like, suppressing variations in the amount of droplets from the inkjet device so as to obtain a precise coating.

The piezoelectric device configured thus has the driving units arranged in a staggered pattern. The piezoelectric device is displaced in a vertical direction coinciding with a voltage direction. This can obtain a displacement in a d33 mode (direction 301 in FIG. 22). The displacement in the d33 mode leads to a maximum displacement with minimum driving power.

As shown in FIG. 9, in order to minimize a driving force transmitted through the piezoelectric device 140, a groove 151 may be formed on the top surface of the piezoelectric device 140, specifically, an upper part between the fifth region 125*a* and the sixth region 125*b*.

The formation of the groove 151 can further reduce a vibration transmission force applied to the second driving unit when the first driving unit is driven. This can also increase a displacement during the application of the same voltage.

Moreover, the formation of the groove 151 can further reduce a vibration transmission force applied to the first driving unit when the second driving unit is driven. This can also increase a displacement during the application of the same voltage.

The inkjet head configured with the piezoelectric device 140 can precisely obtain an inkjet coating as in driving with a single nozzle without affecting the ejection speed or volume of droplets from adjacent nozzles. In other words, an inkjet head coating can be evenly obtained with small variations in droplet volume among the nozzle holes, high densities, and high accuracy.

The groove 151 is formed between the center line L1 and the center line L2 on the top surface of the piezoelectric device 140.

In this example, the first electrodes 101 and the second electrodes 111 reaching three sides of the sheet are simply required to reach at least two sides of the sheet. In this case, the width of a non-electrode formation region can be confirmed in two directions. The electrodes may partially appear on the two different surfaces of the piezoelectric device 140 such that one of the electrodes is connected via one surface of the piezoelectric device 140 to the other surface through the conductive film. The piezoelectric device 140 fundamentally shaped like a square pole may have other shapes.

Figure 5:
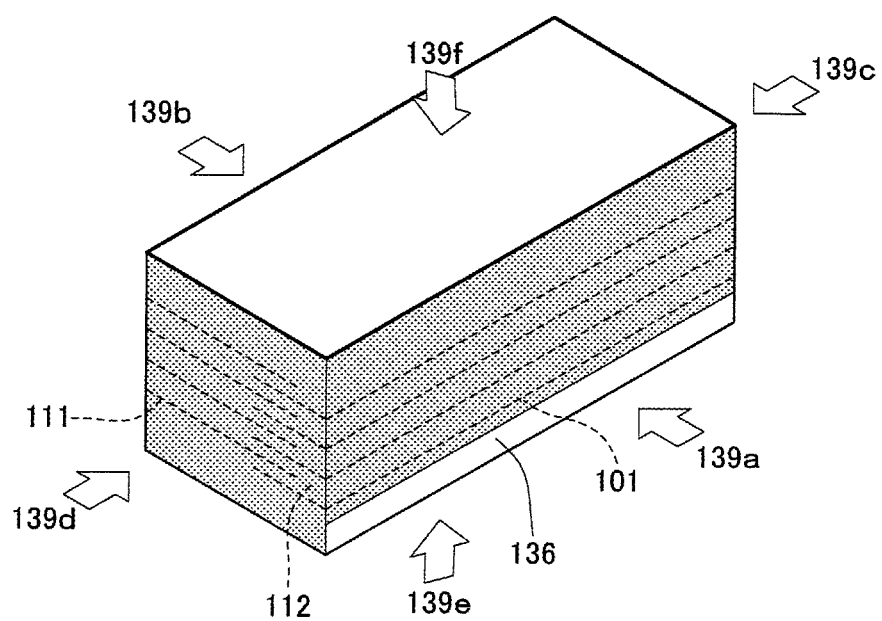
FIG. 5 is a perspective view showing another specific example of the laminated body having the conductive film.

In FIG. 4, the conductive film 138 is formed on the laminated body 139, and then the lower part of the first side of the laminated body 139 is removed so as to remove the unnecessary conductive film 138. When the conductive film 138 is formed, the lower part of the first side of the laminated body 139 may be partially masked so as to form a part 136 uncovered with the conductive film 138 as shown in FIG. 5.

Second Embodiment

In the first embodiment, the first electrode 101 formed on the first sheet 100 and the second electrode 111 formed on the second sheet 110 are identical in shape. In a second embodiment, a first electrode 101 and a second electrode 111 have different shapes.

Figure 10:
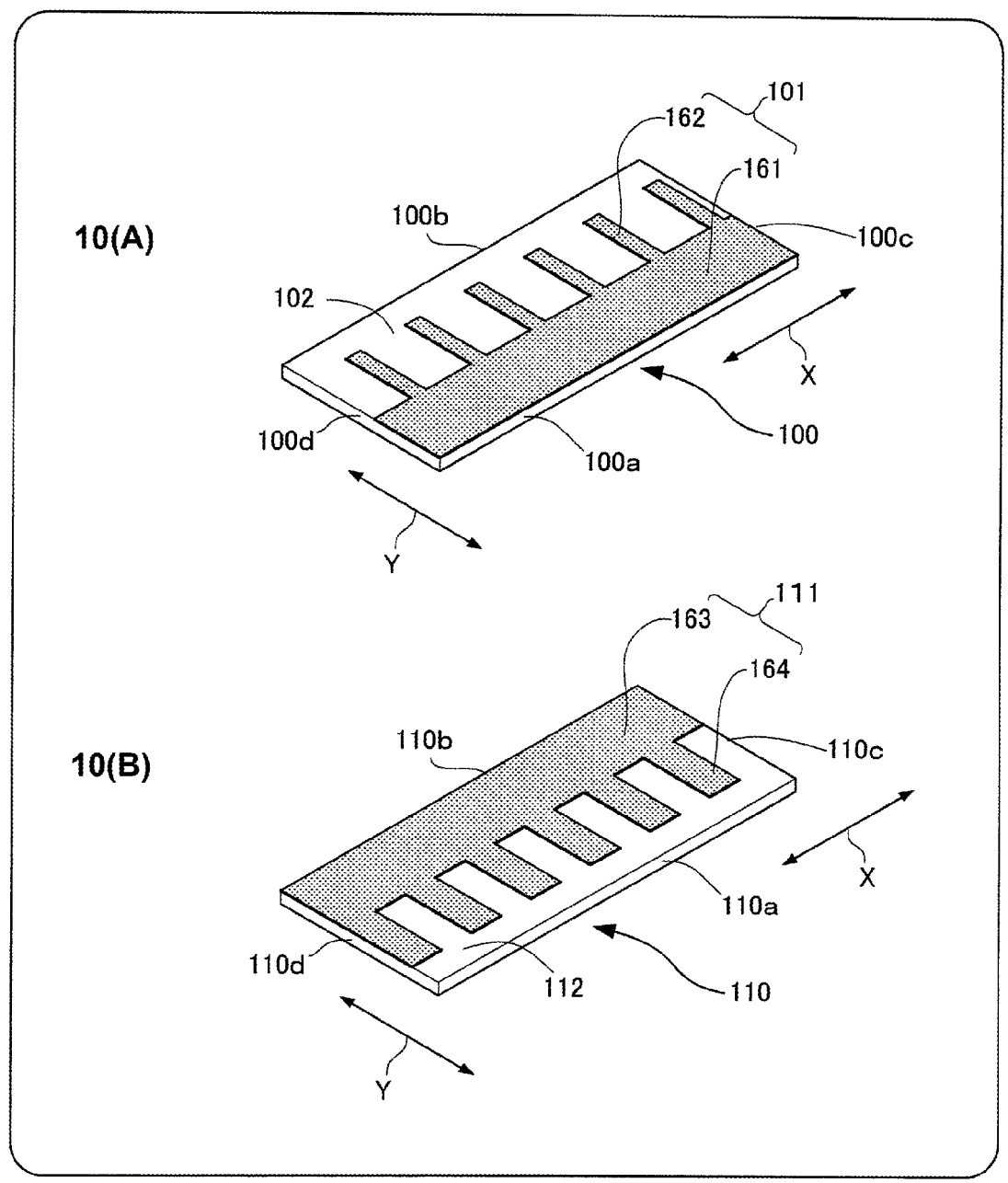
FIG. 10 (A) is a perspective view of a first sheet used for a piezoelectric device according to a second embodiment of the present invention.

As shown in FIG. 10(*b*), the second electrode 111 formed on a second sheet 110 in the second embodiment is identical in shape to that in FIG. 1(*b*) of the first embodiment, whereas on a first sheet 100 in FIG. 10(*a*), the width of a second region 162 of the first electrode 101 is smaller than the width of a fourth region 164 of the second electrode 111 in an X direction. Other configurations are identical to those of the first embodiment.

The first and second sheets 100 and 110 are alternately stacked on a third sheet 120 at the bottom. After that, the sheets are sintered with a third sheet 120 stacked at the top. This configuration is identical to that of the first embodiment.

Figure 11:
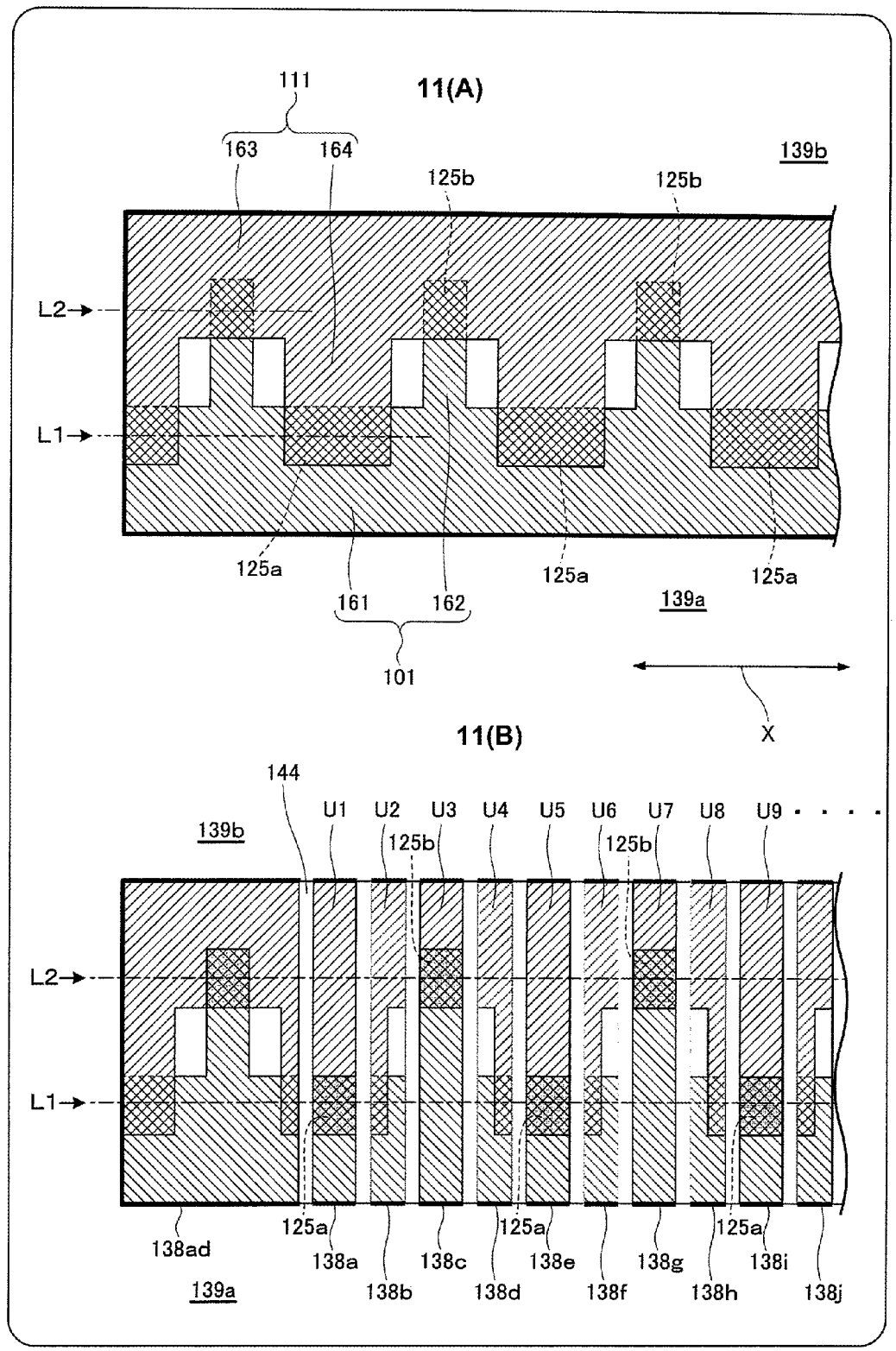
FIG. 11 (A) is a perspective view of a laminated body with stacked electrodes viewed from the top surface of the piezoelectric device before grooves 144 are formed, according to the second embodiment.

FIG. 11(*a*) shows an overlapping state of the first electrode 101 and the second electrode 111 in the stacking direction. As in the first embodiment, grooves 144 are subjected to dicing as shown in FIG. 11(*b*).

Specifically, even if the first electrode 101 and the second electrode 111 have different widths, a piezoelectric device 140 can be obtained by dicing with fifth and sixth regions 125*a* and 125*b* arranged in a staggered pattern as in the first embodiment.

Third Embodiment

Figure 12:
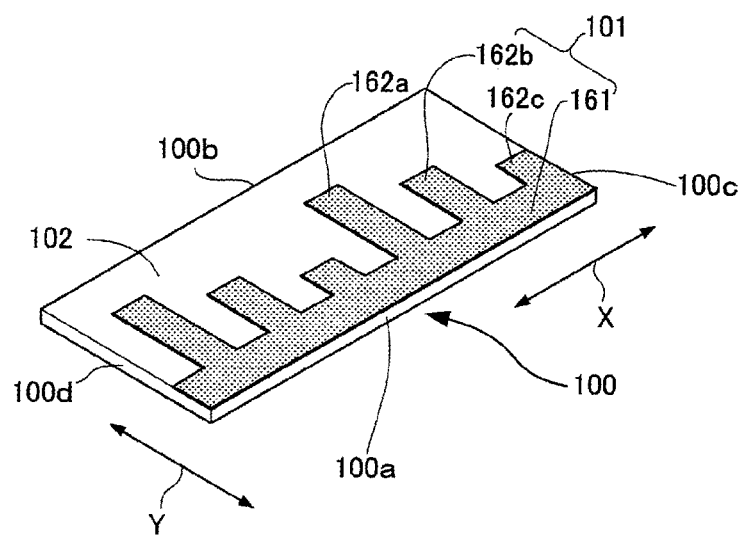
FIG. 12 (A) is a perspective view of a first sheet used for a piezoelectric device according to a third embodiment of the present invention.
Figure 12:
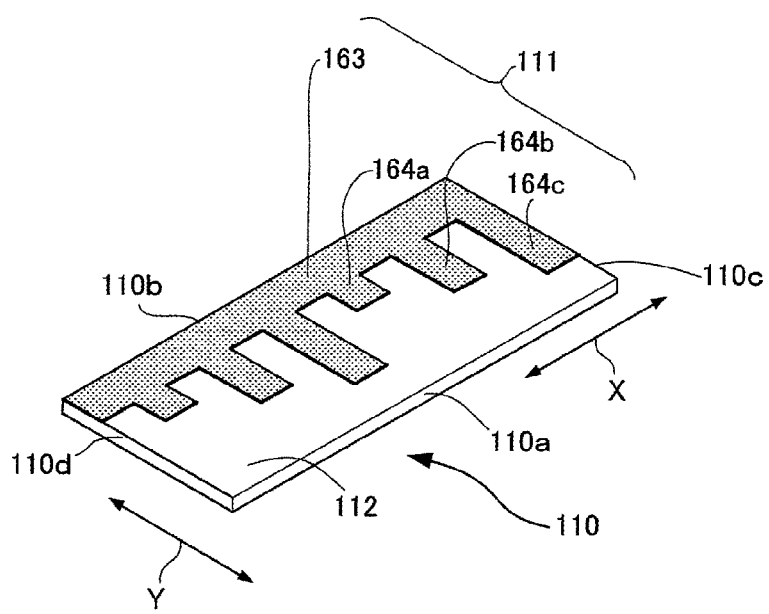

FIGS. 12(*a*), 12(*b*), 13(*a*), and 13(*b*) show a third embodiment of the present invention.

First and second electrodes 101 and 111 on first and second sheets 100 and 110 used in the third embodiment have different shapes from those of the first embodiment.

FIG. 12(*a*) shows the first sheet 100 used in the third embodiment. The first electrode 101 on the first sheet 100 has second regions 162*a*, 162*b*, and 162*c* that vary in length so as to satisfy 162*a*>162*b*>162*c*.

FIG. 12(*b*) shows the second sheet 110 used in the third embodiment. The second electrode 111 on the second sheet 110 has fourth regions 164a, 164b, and 164c that vary in length so as to satisfy 164a<164b<164c.

As in the first embodiment, the first sheets 100 and the second sheets 110 are alternately stacked on a third sheet 120 disposed at the bottom. Furthermore, another third sheet 120 is stacked at the top and then the sheets are sintered as in the first embodiment.

Figure 13:
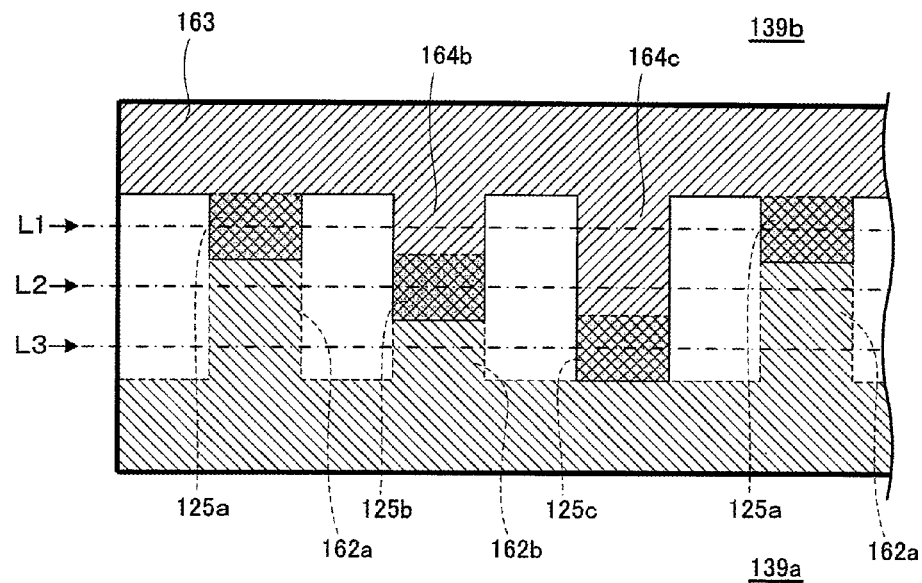
FIG. 13 (A) is a perspective view of a laminated body with stacked electrodes viewed from the top surface of the piezoelectric device before grooves 144 are formed according to the third embodiment.
Figure 13:
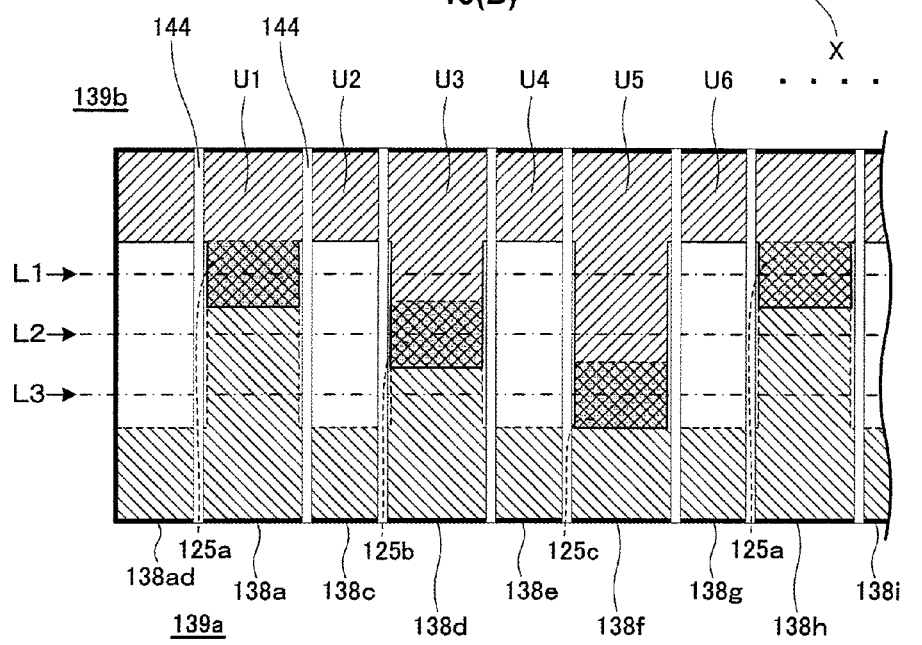

FIG. 13(a) shows an overlapping state of the first electrode 101 and the second electrode 111 in the stacking direction. As in the first embodiment, grooves 144 are subjected to dicing as shown in FIG. 13(b).

Specifically, the sheets are divided into units U1, U2, U3, U4, U5, U6, U7, . . . by the grooves 144. In the units U1, U7, . . . , the fourth region 164a of the second electrode 111 and the end of the second region 162a of the first electrode 101 overlap each other in the stacking direction, forming a fifth region 125a.

In the units U3, U9, . . . , the end of the fourth region 164b of the second electrode 111 and the end of the second region 162b of the first electrode 101 overlap each other in the stacking direction, forming a sixth region 125b.

In the units U5, U11, . . . , the end of the fourth region 164c of the second electrode 111 and the second region 162c of the first electrode 101 overlap each other in the stacking direction, forming a seventh region 125c.

The units U2, U4, U6, U8, . . . , in which the first electrodes 101 and the second electrodes 111 are not overlapped in the stacking direction, are configured between the units U1 and U3, between the units U3 and U5, and between the units U5 and U7, . . . .

In FIGS. 13(a) and 13(b), a center line L1 along a longitudinal direction X passes through the centers of the adjacent fifth regions 125a. A center line L2 along the longitudinal direction X passes through the centers of the adjacent sixth regions 125b. A center line L3 along the longitudinal direction X passes through the centers of the adjacent seventh regions 125c.

Thus, a piezoelectric device 140 can be obtained such that the fifth regions 125a, the sixth regions 125b, and the seventh regions 125c are arranged in a staggered pattern. The units U2, U4, U6, and U8, . . . not to be driven are disposed between the units U1 and U3 to be driven, between the units U3 and U5 to be driven, and between the units U5 and U7 to be driven . . . . This can precisely obtain an inkjet coating as in driving with a single nozzle without affecting the ejection speed or volume of droplets from adjacent nozzles. In other words, an inkjet head coating can be evenly obtained with small variations in droplet volume among nozzle holes, high densities, and high accuracy.

Fourth Embodiment

Figure 14:
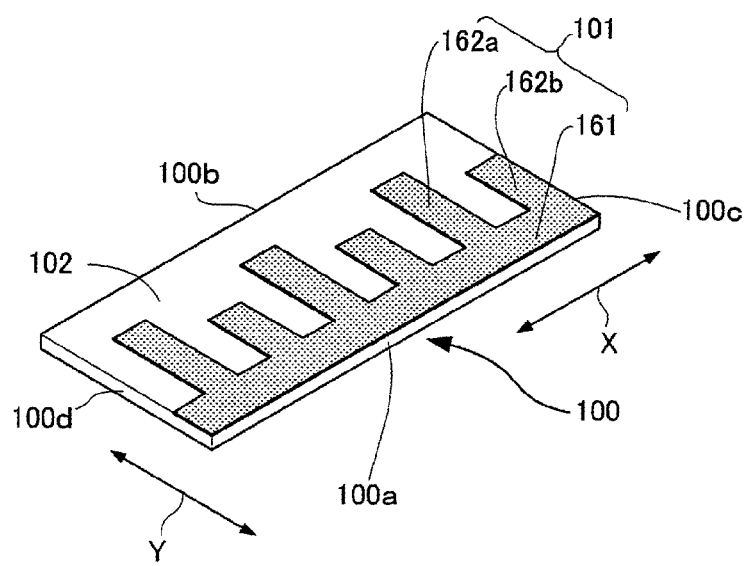
FIG. 14 (A) is a perspective view of a first sheet used for a piezoelectric device according to a fourth embodiment of the present invention.
Figure 14:
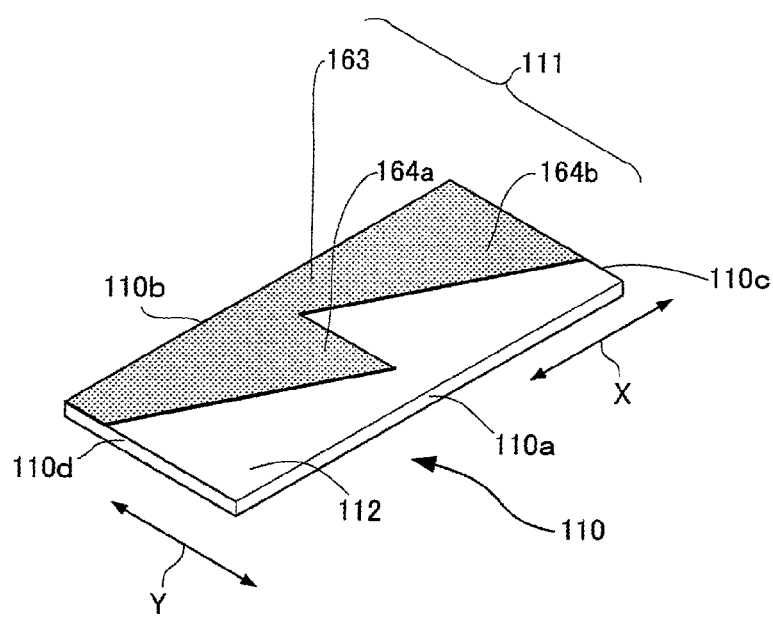
Figure 15:
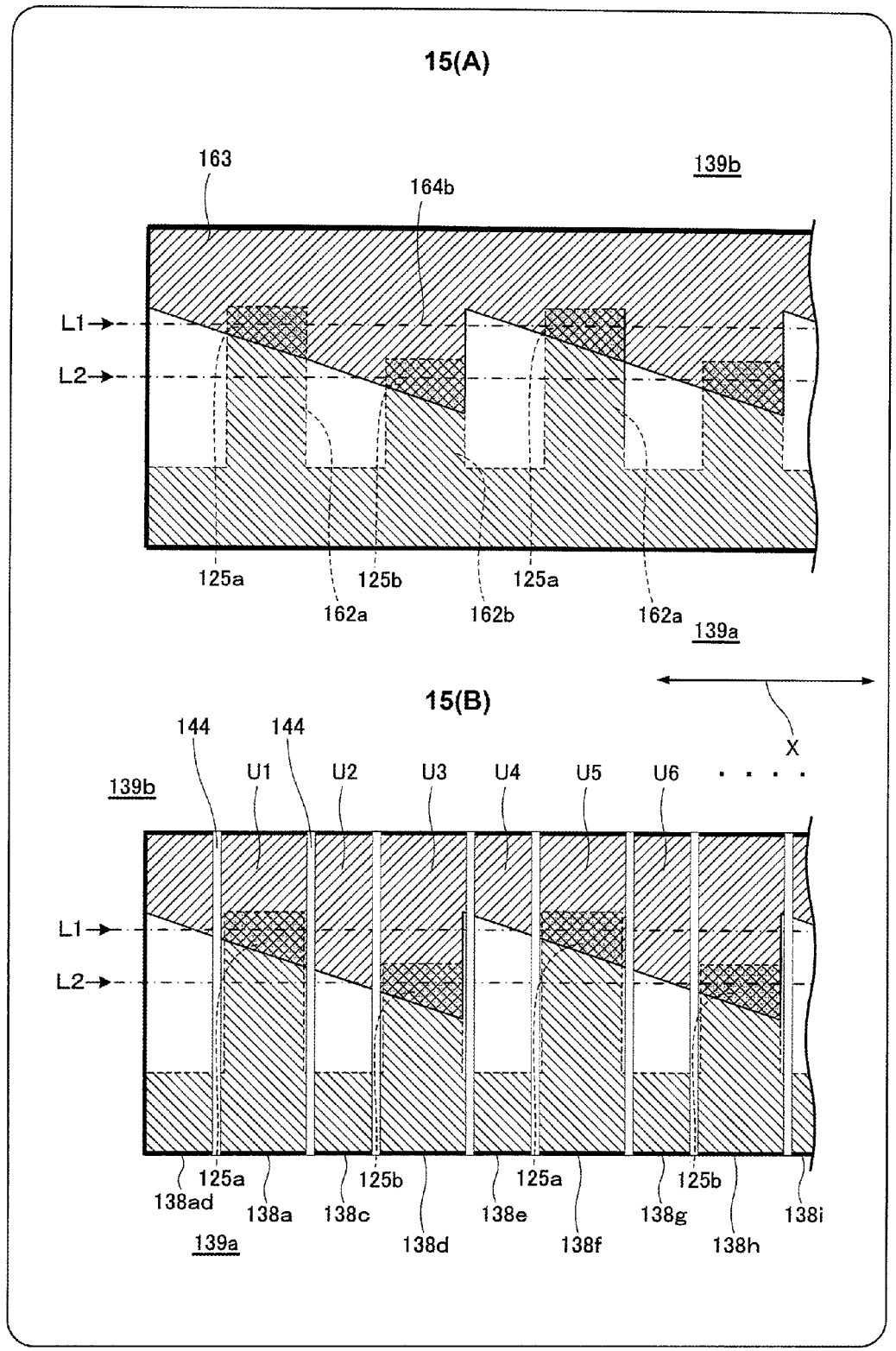
FIG. 15 (A) is a perspective view of a laminated body with stacked electrodes viewed from the top surface of the piezoelectric device before grooves 144 are formed.
Figure 16:
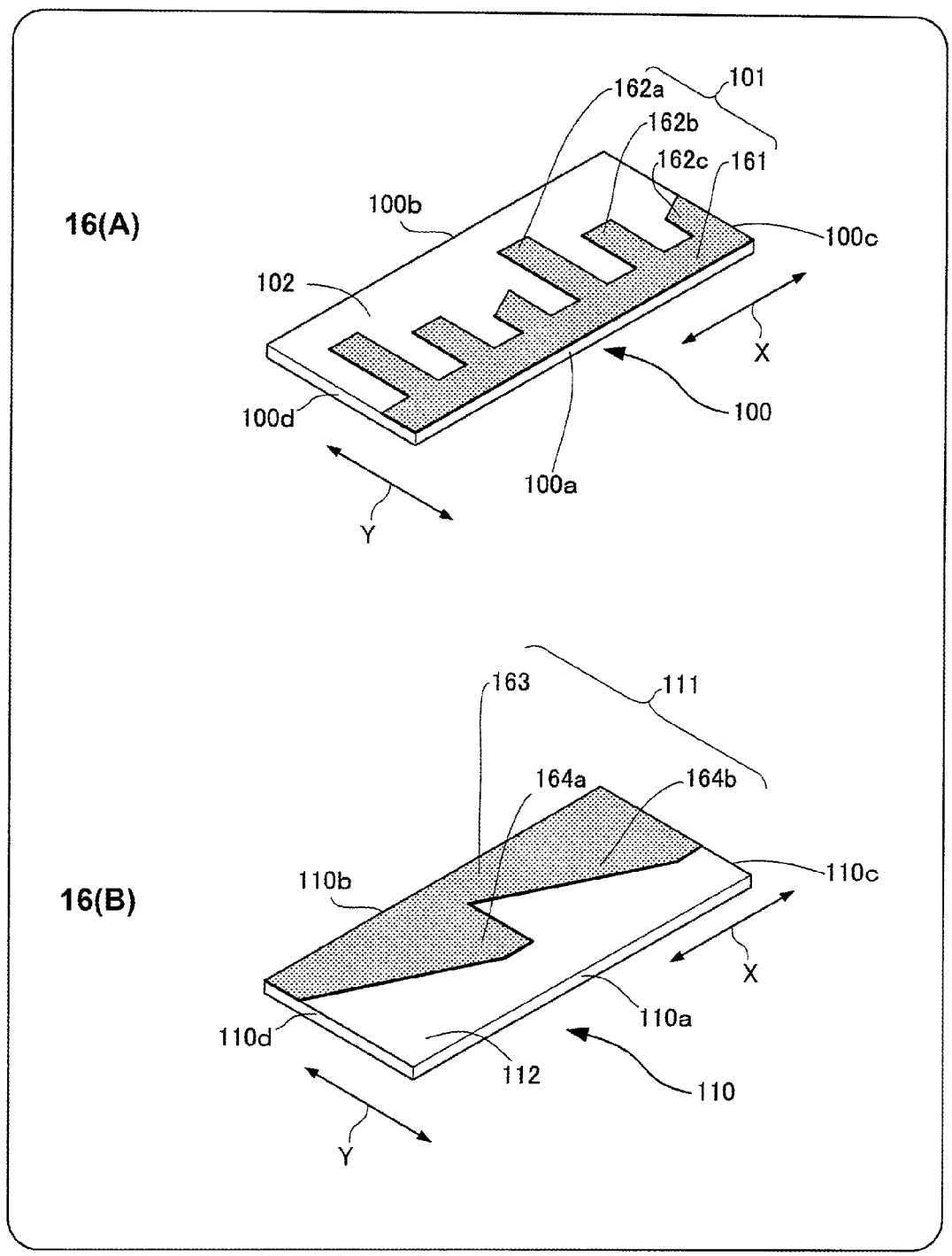
FIG. 16 (A) is a perspective view of a first sheet used for a piezoelectric device according to a fifth embodiment of the present invention.

FIGS. 14 and 15 show a fourth embodiment of the present invention.

In the foregoing embodiments, the first and second electrodes 101 and 111 are shaped like comb teeth, whereas in the fourth embodiment, a first electrode 101 is shaped like comb teeth while a second electrode 111 is shaped like saw teeth. The first electrode 101 has second regions 162a and 162b such that the second region 162a is longer than the second region 162b. As shown in FIG. 15(a), the repeating period of fourth regions 164a and 164b of the second electrode 111 is formed such that the inclination and length of an inclined part in an X direction cross the ends of the second regions 162a and 162b when first and second sheets 100 and 110 are stacked.

Other configurations are identical to those of the first embodiment. The first and second sheets 100 and 110 and a third sheet 120 are stacked as in FIG. 3, a conductive film 138 is formed, and grooves 144 are formed to divide the sheets into units U1, U2, . . . .

FIG. 15(b) is a perspective view showing a stacked state of the electrodes viewed from the top surface of a piezoelectric device 140 with the formed grooves 144. The piezoelectric device 140 can be obtained with staggered fifth and sixth regions 125a and 125b in which the ends of the second regions 162a and 162b of the first electrode 101 overlap the fourth regions 164a and 164b of the second electrode 111.

The shapes of the first electrode 101 and the second electrode 111 may be reversed.

Fifth Embodiment

FIGS. 16(a) and 16(b) and FIGS. 17(a) and 17(b) show a fifth embodiment.

Figure 17:
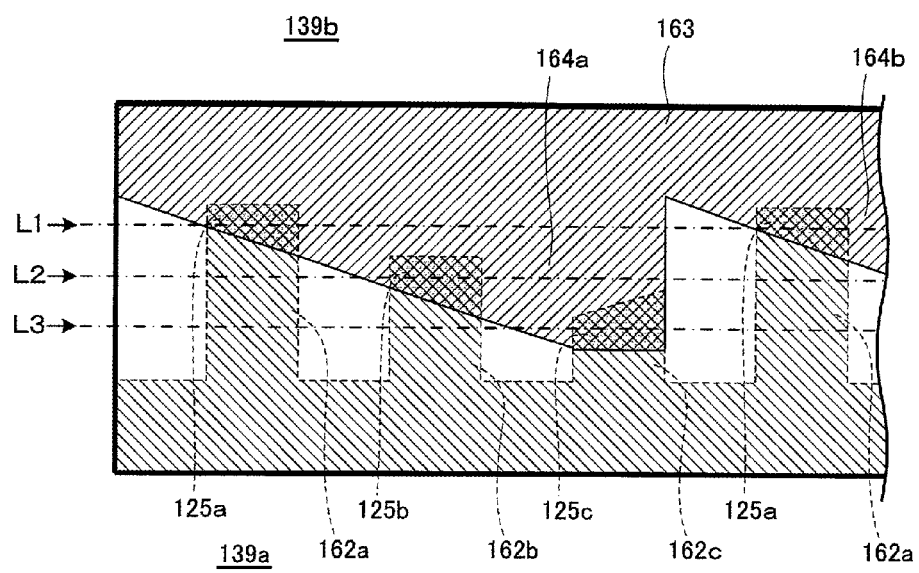
FIG. 17 (A) is a perspective view of a laminated body with stacked electrodes viewed from the top surface of the piezoelectric device before grooves 144 are formed.
Figure 17:
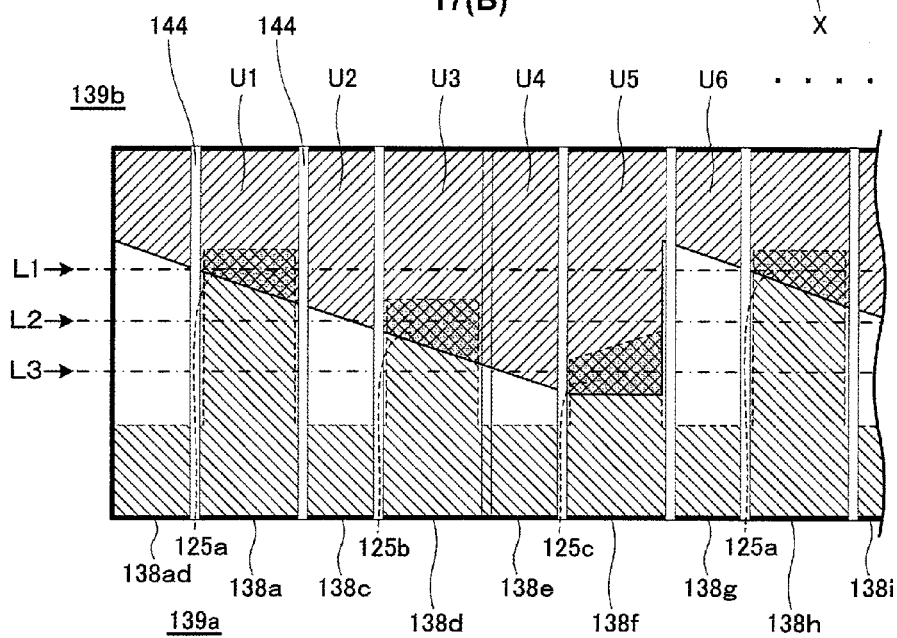

In the foregoing embodiments, the piezoelectric device 140 viewed in the stacking direction has the two center lines L1 and L2 passing through the fifth and sixth regions 125a and 125b in which the first electrodes 101 and the second electrodes 111 are opposed to each other. In the fifth embodiment, a center line L3 passes through a seventh region 125c in which a first electrode 101 and a second electrode 111 are opposed to each other, in addition to center lines L1 and L2 of fifth and sixth regions 125a and 125b. The first electrode 101 is shaped like comb teeth while the second electrode 111 is shaped like saw teeth. The first electrode 101 has second regions 162a, 162b, and 162c varying in length so as to satisfy 162a>162b>162c. As shown in FIG. 17(a), the repeating period of fourth regions 164a and 164b of the second electrode 111 is formed such that the inclination and length of an inclined part in an X direction cross the ends of the second regions 162a, 162b, and 162c when first and second sheets 100 and 110 are stacked.

Other configurations are identical to those of the fourth embodiment. The first and second sheets 100 and 110 and a third sheet 120 are stacked as in FIG. 3, a conductive film 138 is formed, and grooves 144 are formed to divide the sheets into units U1, U2, . . . .

FIG. 17(b) is a perspective view showing a stacked state of the electrodes viewed from the top of a piezoelectric device 140 with the formed grooves 144. The piezoelectric device 140 can be obtained with the staggered fifth, sixth, and seventh regions 125a, 125b, and 125c in which the ends of the second regions 162a, 162b, and 162c of the first electrode 101 overlap the fourth regions 164a and 164b of the second electrode 111.

The shapes of the first electrode 101 and the second electrode 111 may be reversed.

In the foregoing embodiments, the electrodes are rectangular like the second region 162 of the first electrode 101 and the fourth region 164 of the second electrode 111. The shapes of the electrodes are not limited to rectangles and may be trapezoidal or triangular as long as only the ends of the regions respectively overlap the first region 161 and the third region 163 when the sheets are stacked.

In the foregoing embodiments, the first region 161 of the first electrode 101 and the third region 163 of the second electrode 111 may partially overlap each other but should not have a large overlapping region when stacked.

The piezoelectric device 140 according to the foregoing embodiments is usable for a piezo inkjet head. Specifically, an inkjet printer is configured as shown in FIGS. 18(a), 18(b), and 18(c).

Figure 18:
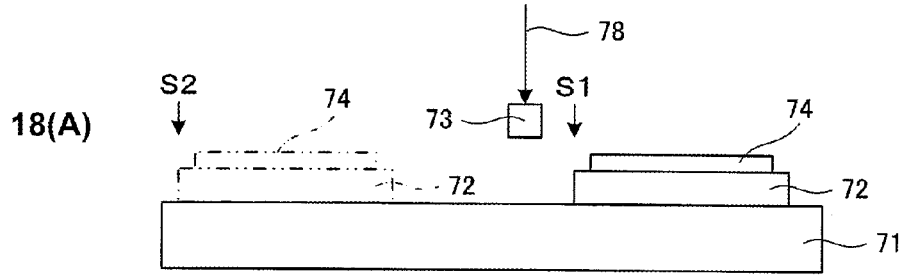
FIG. 18 (A) is a front view of an inkjet printer including the piezoelectric device according to the foregoing embodiments.
Figure 18:
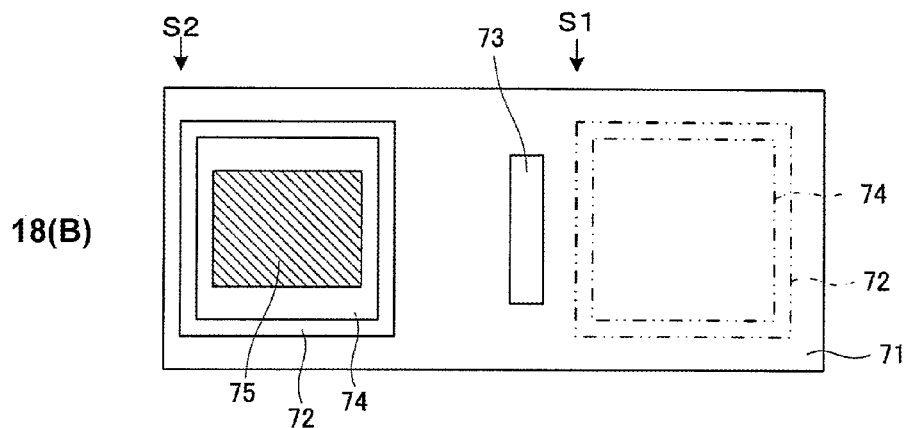
Figure 18:
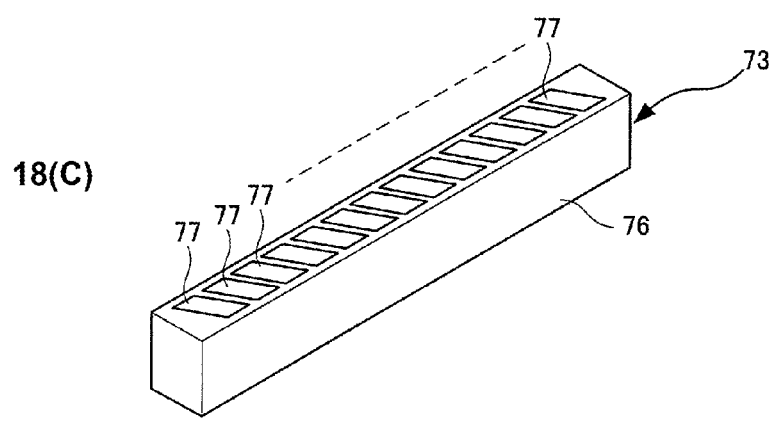
Figure 19:
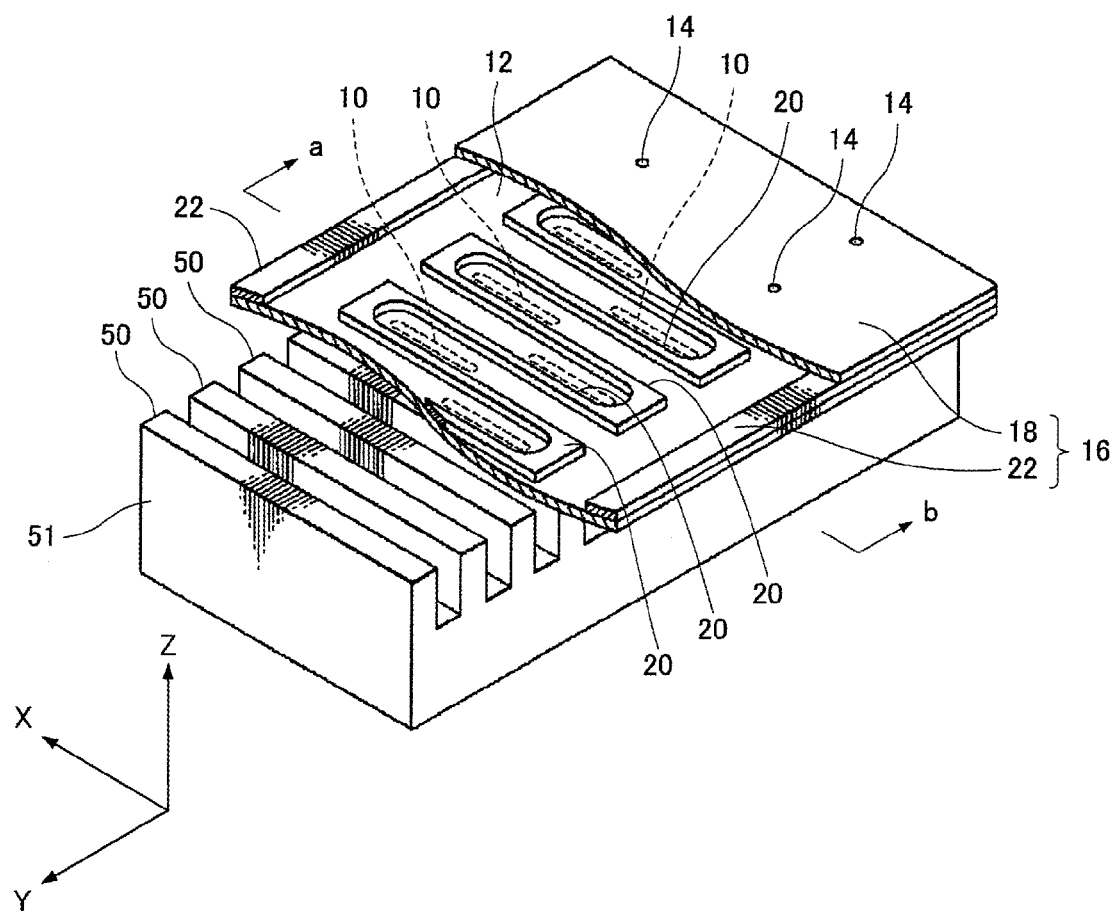
FIG. 19 is a perspective view of an inkjet head including a conventional piezoelectric device.
Figure 20:
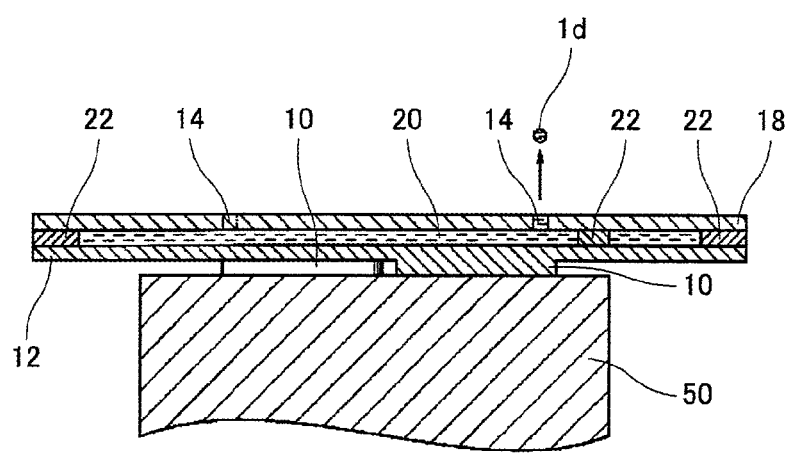
FIG. 20 is a cross-sectional view of the inkjet head including the conventional piezoelectric device.

The inkjet printer includes a base 71, a substrate transport stage 72, and a line head 73. The substrate transport stage 72 with a substrate 74 to be coated moves from a solid line position S1 to a virtual line position S2 in FIG. 18(*a*). The line head 73 is installed above a route from the solid line position S1 to the virtual line position S2. While the substrate 74 is transported by the substrate transport stage 72, ink is properly ejected from the line head 73 and is applied to a coating region 75 of the substrate 74 to perform printing as shown in FIG. 18(*b*). As shown in FIG. 18(*c*), the line head 73 has a casing 76 including a plurality of inkjet heads 77. The nozzles of the inkjet heads 77 are directed to the substrate transport stage 72. Ink supplied to the casing 76 from the outside through an ink supply pipe 78 is ejected from the inkjet heads 77 to the substrate 74 with the inkjet heads 77 deformed by a voltage according to a desired printing pattern.

Specifically, the inject printer can be used for producing the color filter of a liquid crystal display device and an electroluminescence display device. The ink contains color components and is applicable to coatings on an intermediate layer and a hole transport layer. Devices can be inexpensively manufactured using the inkjet printer with a simple manufacturing process.

The present invention is usable for piezoelectric devices. The piezoelectric devices are usable for inkjet devices.

What is claimed is:

1. A piezoelectric device composed of a laminated body in which a first sheet and a second sheet are stacked,
   the piezoelectric device comprising:
      a plurality of units that are separated in a first direction by a plurality of grooves formed on a top surface of the laminated body toward an undersurface of the laminated body, the plurality of units having a plurality of first and second driving units, each of the plurality of grooves interposing between each of the plurality of first driving units and each of the plurality of second driving units;
      a conductive film formed on a surface of the laminated body;
      a first electrode formed on the first sheet and extending to each end of the first sheet in the first direction; and
      a second electrode formed on the second sheet and extending to each end of the second sheet in the first direction,
   wherein the first electrode comprises a first region having a proximal end located on a first side of the laminated body and a second region having an end directed to a second side of the laminated body,
   the second electrode comprises a third region having a proximal end located on the second side and a fourth region having an end directed to the first side, the first and second sides opposing to each other in a second direction perpendicular to the first direction,
   the conductive film electrically connects the second electrode on the second side and a part of the first electrode on the first side,
   the plurality of units alternatively comprise (a) a fifth region where the fourth region and the first region are overlapping each other or (b) a sixth region where the second region and the third region are overlapping each other,
   the fifth region is present at each of the plurality of first driving units and the sixth region is present at each of the plurality of second driving units, and
   a first straight line connecting each center of the fifth region of the first driving units and a second straight line connecting each center of the sixth region of the second driving units are located at different positions when viewed in a stacking direction.

2. The piezoelectric device according to claim 1, wherein shapes of the first electrode and the second electrode are different.

3. The piezoelectric device according to claim 1, wherein the first sheet and the second sheet are shaped like a square.

4. The piezoelectric device according to claim 1, wherein the fifth region and the sixth region are not opposed to each other in the stacking direction of the laminated body.

5. The piezoelectric device according to claim 1, wherein the first sheet comprises the first electrode formed on three of four sides of the first sheet and a first non-electrode region having no electrodes on the other side of the first sheet and
   the second sheet comprises the second electrode formed on three of four sides of the second sheet and a second non-electrode region having no electrodes on the other side of the second sheet.

6. The piezoelectric device according to claim 1, wherein the intermediate unit including both of the fifth region and the sixth region is located between the plurality of first driving units including the fifth region and the plurality of second driving units including the sixth region.

7. The piezoelectric device according to claim 1, wherein the intermediate unit including only one of the fifth region and the sixth region is located between the plurality of first driving units including the fifth region and the plurality of second driving units including the sixth region.

8. The piezoelectric device according to claim 1, wherein the second region comprises a plurality of electrodes extending with different lengths from the first region to the second side, and
   the fourth region comprises a plurality of electrodes extending with different lengths from the third region to the first side.

9. An inkjet head for applying ink to an object to be coated, by means of the piezoelectric device according to claim 1.

10. An inkjet device for applying ink to an object to be coated, by means of the inkjet head according to claim 9.

11. An application method for applying ink to an object to be coated, by means of the piezoelectric device according to claim 1.

* * * * *